United States Patent
Choi et al.

(10) Patent No.: US 10,651,034 B2
(45) Date of Patent: May 12, 2020

(54) THERMAL ABSORPTION COATING ON SAPPHIRE FOR EPITAXIAL PROCESS

(71) Applicant: U.S.A. as represented by the Administrator of the National Aeronautics and Space Administration, Washington, DC (US)

(72) Inventors: Sang H. Choi, Poquson, VA (US); Adam J. Duzik, Yorktown, VA (US)

(*) Notice: Subject to any disclaimer, the term of this patent is extended or adjusted under 35 U.S.C. 154(b) by 299 days.

(21) Appl. No.: 15/474,234

(22) Filed: Mar. 30, 2017

(65) Prior Publication Data

US 2017/0287710 A1   Oct. 5, 2017

Related U.S. Application Data

(60) Provisional application No. 62/315,383, filed on Mar. 30, 2016.

(51) Int. Cl.
| | |
|---|---|
| *H01L 21/02* | (2006.01) |
| *C30B 23/02* | (2006.01) |
| *C30B 23/06* | (2006.01) |
| *C30B 29/40* | (2006.01) |
| *C30B 29/52* | (2006.01) |

(52) U.S. Cl.
CPC ...... *H01L 21/02658* (2013.01); *C30B 23/025* (2013.01); *C30B 23/063* (2013.01); *C30B 29/406* (2013.01); *C30B 29/52* (2013.01); *H01L 21/0242* (2013.01); *H01L 21/0254* (2013.01); *H01L 21/02376* (2013.01); *H01L 21/02422* (2013.01); *H01L 21/02532* (2013.01)

(58) Field of Classification Search
CPC ......... H01L 21/02658; H01L 21/02422; H01L 21/02532; H01L 21/0254; H01L 21/0242; H01L 21/02376; C30B 29/52; C30B 29/406; C30B 23/063; C30B 23/025
See application file for complete search history.

(56) References Cited

U.S. PATENT DOCUMENTS

| | | | |
|---|---|---|---|
| 7,558,371 B2 | 7/2009 | Park et al. | |
| 8,226,767 B2 | 7/2012 | Park et al. | |
| 9,449,818 B2 | 9/2016 | Park et al. | |
| 9,455,374 B2 | 9/2016 | Park et al. | |
| 2010/0233483 A1* | 9/2010 | Kawase | C23C 8/02 428/408 |
| 2013/0164654 A1* | 6/2013 | Suzuki | H01M 8/0206 429/509 |
| 2014/0264325 A1* | 9/2014 | Park | H01L 21/02532 257/43 |

(Continued)

*Primary Examiner* — Matthew J Song
(74) *Attorney, Agent, or Firm* — Jennifer L. Riley; Robin W. Edwards; Helen M. Galus (57) ABSTRACT

A method of forming an epitaxial layer on a substrate such as a sapphire wafer that does not readily absorb thermal radiation. The method includes coating a first side surface of the substrate with an energy-absorbing opaque material. The opaque material forms a thermally absorptive coating on the substrate. The coated substrate may be heated to remove contaminants from the thermally absorptive coating. The coated substrate is positioned in a vacuum deposition chamber and heated by directing radiative energy onto the thermally absorptive coating. An epitaxial layer such as GaN or SiGe is formed on a second side surface of the substrate opposite the thermally absorptive coating.

20 Claims, 5 Drawing Sheets

(56) References Cited

U.S. PATENT DOCUMENTS

| | | | |
|---|---|---|---|
| 2014/0264459 A1 | 9/2014 | Choi et al. | |
| 2014/0334071 A1* | 11/2014 | Endo | H01G 9/15 |
| | | | 361/528 |
| 2014/0339580 A1* | 11/2014 | Park | H01L 33/08 |
| | | | 257/90 |
| 2016/0257612 A1* | 9/2016 | de Paor | C03C 25/10 |

* cited by examiner

THERMAL ABSORPTION COATING ON SAPPHIRE FOR EPITAXIAL PROCESS

CROSS-REFERENCE TO RELATED PATENT APPLICATION

This patent application claims the benefit of and priority to U.S. Provisional Patent Application No. 62/315,383 filed on Mar. 30, 2016, titled "THERMAL ABSORPTION COATING (TAC) ON SAPPHIRE FOR EPITAXIAL PROCESS," the contents of which is hereby incorporated by reference in its entirety.

STATEMENT REGARDING FEDERALLY SPONSORED RESEARCH OR DEVELOPMENT

The invention described herein was made in the performance of work under a NASA contract and by an employee of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the contractor elected not to retain title.

BACKGROUND OF THE INVENTION

Epitaxy is a process by which one or more crystalline overlayers are deposited on a crystalline substrate (e.g. sapphire). Various processes for fabricating sapphire substrates (wafers) and related devices have been developed, as described in U.S. Pat. Nos. 9,449,818, 9,455,374, 7,558,371, 8,226, 767 and U.S. Patent Publication No. 20140264459. Epitaxy processes involving semiconductor materials such as cubic or zinc blende on a sapphire substrate (wafer) typically require the sapphire substrate/wafer to be at a high temperature in the range of about 600° C. to about 1000° C. For example, the growth of a GaN epitaxial layer on a sapphire substrate for LED fabrication may require a sapphire substrate temperature of about 850° C. Forming an SiGe epitaxial layer on a sapphire substrate may require a sapphire substrate temperature of about 890° C. Known methods to heat sapphire substrates may suffer from problems such as low yield and/or high production cost. For example, if the heat absorption rate of a sapphire substrate is low, heating the substrate to the desired temperature may be slow, leading to increased expense.

Because heating of sapphire substrates/wafers generally occurs in a vacuum environment, the sapphire substrates or wafers cannot be heated utilizing conductive or convective heat transfer. Thus, radiative heat sources/transfer must be utilized. However, because the sapphire substrates/wafers may be optically transparent, the sapphire substrates/wafers do not readily absorb radiative energy.

There are at least two known processes for heating sapphire substrates for epitaxial processes. First, the sapphire substrates may be positioned in a heated nitrogen or argon charged vacuum chamber for several hours to raise the temperature of the sapphire substrates. A plurality of the sapphire substrates may be positioned in the chamber to provide a batch process. Another known method of heating sapphire substrates involves coating a sapphire substrate/wafer with a metallic or carbon film utilizing a sputtering process. The coating may be deposited on a back surface of a sapphire substrate/wafer. The coating may be light-absorbing, and the coating can therefore absorb thermal radiation from a heat source to heat the sapphire substrate/wafer.

Because sapphire is optically thin and transparent, it may be difficult to raise the temperature of a sapphire substrate/wafer in a vacuum environment to a desired (uniform) level over the entire area of the sapphire substrate. Although thermal energy can be transferred from a heating element to a sapphire substrate/wafer by conduction through direct contact, direct conduction may cause uneven heating. Thus, conductive heating is prone to hot spots, thermal stresses, and subsequent breaking of the sapphire substrates/wafers. Convection is impossible in vacuum. Conduction and convection are therefore not viable methods for heating sapphire substrates/wafers in a vacuum for epitaxial processes.

BRIEF SUMMARY OF THE INVENTION

One aspect of the present disclosure is a method of forming an epitaxial layer on a sapphire wafer. The sapphire wafer has first and second opposite side surfaces. The method includes coating the first opposite side surface of the sapphire wafer with an energy-absorbing opaque material that is stable at high temperatures to thereby form a thermal absorption coating on the first side of the sapphire wafer. The coated sapphire wafer is incrementally heated to remove contaminants from the thermal absorption coating. The coated sapphire wafer is then cooled, and the coated sapphire wafer is positioned in a vacuum deposition chamber. The coated sapphire wafer is then heated in the vacuum deposition chamber by directing radiative energy onto the thermal absorption coating. An epitaxial layer is then formed on the second side of the coated sapphire wafer opposite the thermal absorption coating.

The thermal absorption coating may comprise paint that is applied using a room temperature spray process. The process may include allowing the paint to dry at room temperature before removing contaminants from the thermal absorption coating by incrementally heating the coated sapphire wafer. The paint may include copper and/or chromium and/or carbon black pigments. The sapphire wafer may comprise a C-plane sapphire material, and the method may include polishing the first and second opposite sides of the sapphire wafer. The method may also include removing the energy-absorbing opaque material from the first opposite side surface, applying an energy-absorbing opaque material onto the epitaxial layer on the second opposite side surface, and forming an epitaxial layer on the first opposite side surface. Incrementally heating the coated sapphire wafer may include heating the coated sapphire wafer to about 650° C. The coated sapphire wafer may be baked at about 400° C. for about 15 minutes, followed by baking at about 500° C. for about 15 minutes, followed by baking at about 650° C. for at least about 20 minutes. The method may include allowing the coated sapphire wafer to cool at room temperature to about 450° C. or less after baking the coated sapphire wafer at about 650° C. The coated sapphire wafer may be heated in the vacuum deposition chamber to a temperature of at least about 850° C., and an epitaxial layer of GaN may be formed on the second opposite side surface of the coated sapphire wafer. The coated sapphire wafer may be heated in the vacuum deposition chamber to a temperature of at least about 890° C. and the method may include forming an epitaxial layer of SiGe on the second opposite side surface of the coated sapphire wafer.

These and other features, advantages, and objects of the present invention will be further understood and appreciated

DETAILED DESCRIPTION OF THE
INVENTION

Figure 1:
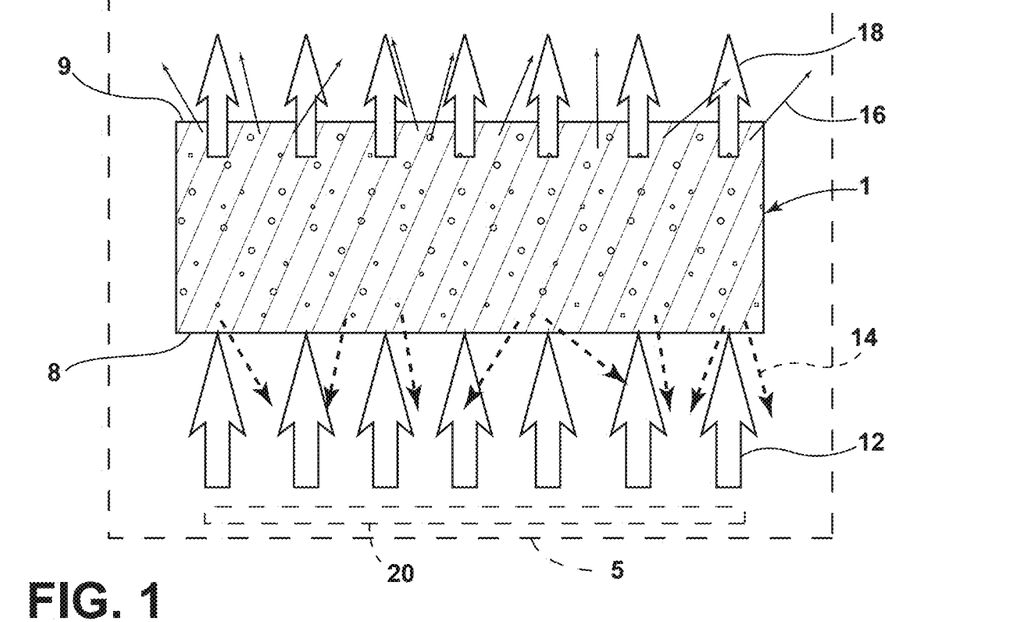
FIG. 1 is a schematic cross sectional view of an uncoated sapphire substrate/wafer in a vacuum environment showing incident thermal energy, transmitted thermal energy, and emitted thermal energy.
Figure 2:
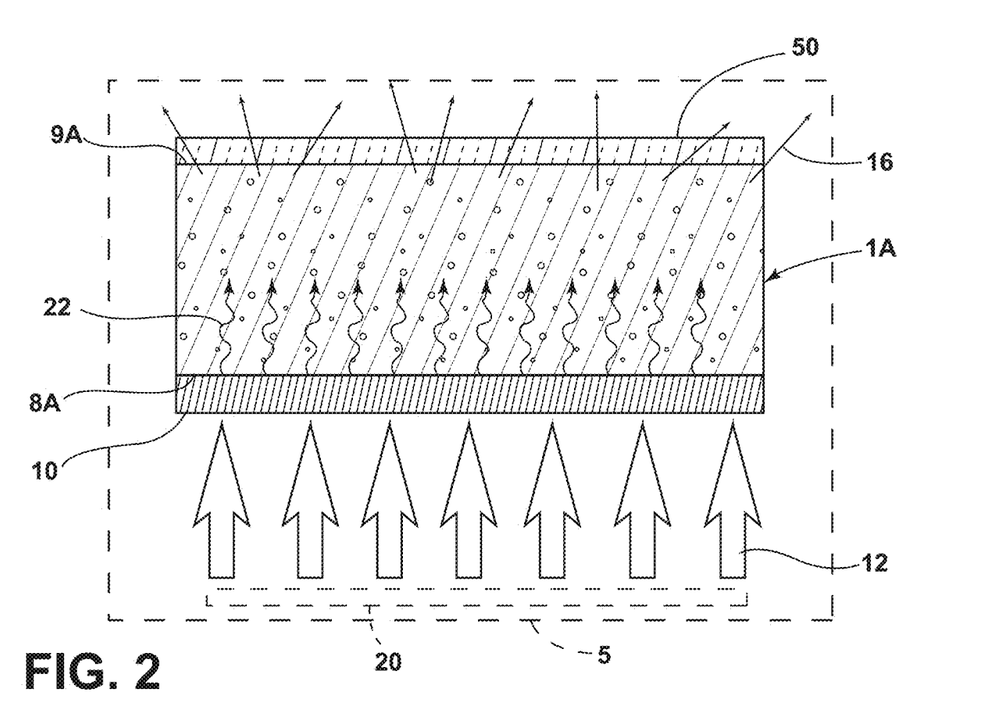
FIG. 2 is a schematic cross sectional view showing a sapphire wafer with a thermal absorption coating and incident and emitted thermal energy.

For purposes of description herein, the terms "upper," "lower," "right," "left," "rear," "front," "vertical," "horizontal," and derivatives thereof shall relate to the components as oriented in FIGS. 1 and 2. However, it is to be understood that the components may assume various alternative orientations and step sequences, except where expressly specified to the contrary. It is also to be understood that the specific devices and processes illustrated in the attached drawings, and described in the following specification, are simply exemplary embodiments of the concepts defined in the appended claims. Hence, specific dimensions and other physical characteristics relating to the embodiments disclosed herein are not to be considered as limiting, unless the claims expressly state otherwise.

With reference to FIG. 1, a heating element 20 may be used to generate radiation 12 that is incident on a surface 8 of a conventional uncoated sapphire substrate/wafer 1 disposed in a vacuum chamber 5. The sapphire substrate 1 is an optically transparent and thin material that does not readily absorb heat from incident thermal radiation 12. Sapphire substrate 1 may be in the form of a wafer (e.g. a thin, flat disk-shaped object). However, the sapphire substrate 1 may have virtually any size or shape (e.g. square, rectangular, etc.) as required for a particular application. Thus, the term "substrate/wafer" as used herein is not limited to any particular geometry, size, shape, thickness, etc. A high percentage of the photons simply pass through uncoated sapphire substrate/wafer 1 and exit surface 9 as radiative heat 18. A small portion 14 of the incident thermal radiation 12 is typically reflected at an uncoated surface 8 of the sapphire substrate/wafer 1. Only a small portion of the incident thermal wave 12 is absorbed while it passes through the sapphire substrate/wafer 1. A portion 16 of the absorbed energy is lost by re-emission process when the temperature of the sapphire substrate/wafer 1 is increased. It will be understood that sapphire substrate/wafer 1 may comprise other optically transparent materials (e.g. ceramics) other than sapphire that are optically transmissive or transparent and do not readily absorb thermal radiation. Thus, the present disclosure is not limited to sapphire substrates. Rather, the materials and processes of the present disclosure may be utilized in connection with virtually any substrate material used in an epitaxial process that is optically transparent or at least partially transmissive of thermal radiation.

With further reference to FIG. 2, the temperature of a sapphire substrate/wafer 1A in a vacuum chamber 5 may be raised more readily by reducing transmission loss. Specifically, a thermally absorptive coating 10 according to the present disclosure facilitates effective heating of a sapphire substrate/wafer 1A in a vacuum chamber 5. The thermally absorptive coating 10 absorbs the radiative thermal energy 12 from heating element 20, and the thermal energy 22, is then conducted from thermally absorptive coating 10 into the sapphire substrate/wafer 1A through surface 8A as shown in FIG. 2. Heating element 20 may be actuated to generate thermal radiation before and/or during and/or after layer 50 is deposited utilizing an epitaxial process. As discussed below, layer 50 may comprise a semiconductor material such as GaN or SiGe. As discussed in more detail below, thermally absorptive coating 10 may comprise high temperature black paint that is applied to surface 8A of the sapphire substrate/wafer 1A via a spraying process.

Figure 3:
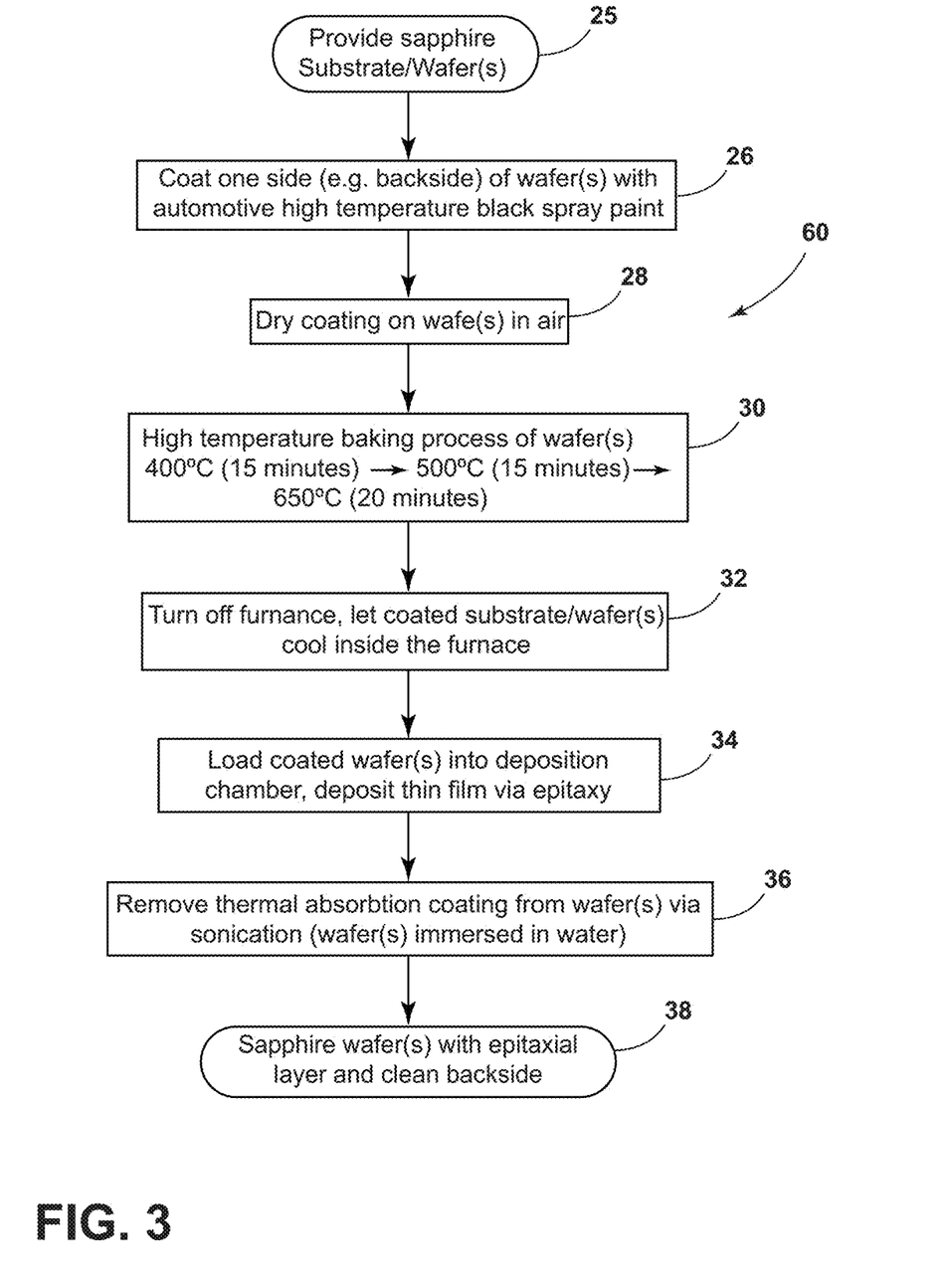
FIG. 3 is a flow diagram showing a process according to one aspect of the present disclosure.

A process 60 according to one aspect of the present disclosure is shown in FIG. 3. One or more suitable substrates such as sapphire substrate/wafers 1A are provided at step 25. Sapphire substrate/wafers 1A may comprise c-plane sapphire or other materials. For example, sapphire substrate 1 may comprise sapphire having other orientations or other materials (e.g. ceramics) that are optically transparent or at least partially optically transmissive. One side (e.g. side 9A, FIG. 2) of the sapphire substrates/wafers 1A may be polished for epitaxy, and the other side 8A may be rough. The rough side 8A may be coated with thermally absorptive coating 10 at step 26. It will be understood that both sides 8A, 9A of the sapphire substrate/wafer 1A may be polished to reduce scatter from laser imaging devices that may be utilized to scan for defects, and/or to permit development of epitaxial domains (films) on both sides 8A and 9A. Surface 8A may be polished, and thermally absorptive coating 10 may be applied to the polished surface 8A. The thermally absorptive coating 10 can be removed from a polished surface 8A without damaging surface 8A utilizing the sonication process described below in connection with FIG. 5. If epitaxial films are to be deposited on polished surface 8A, solvents and/or additional polishing may be utilized to ensure that polished surface 8A is sufficiently clean/smooth to permit further epitaxial processing.

Figure 4:
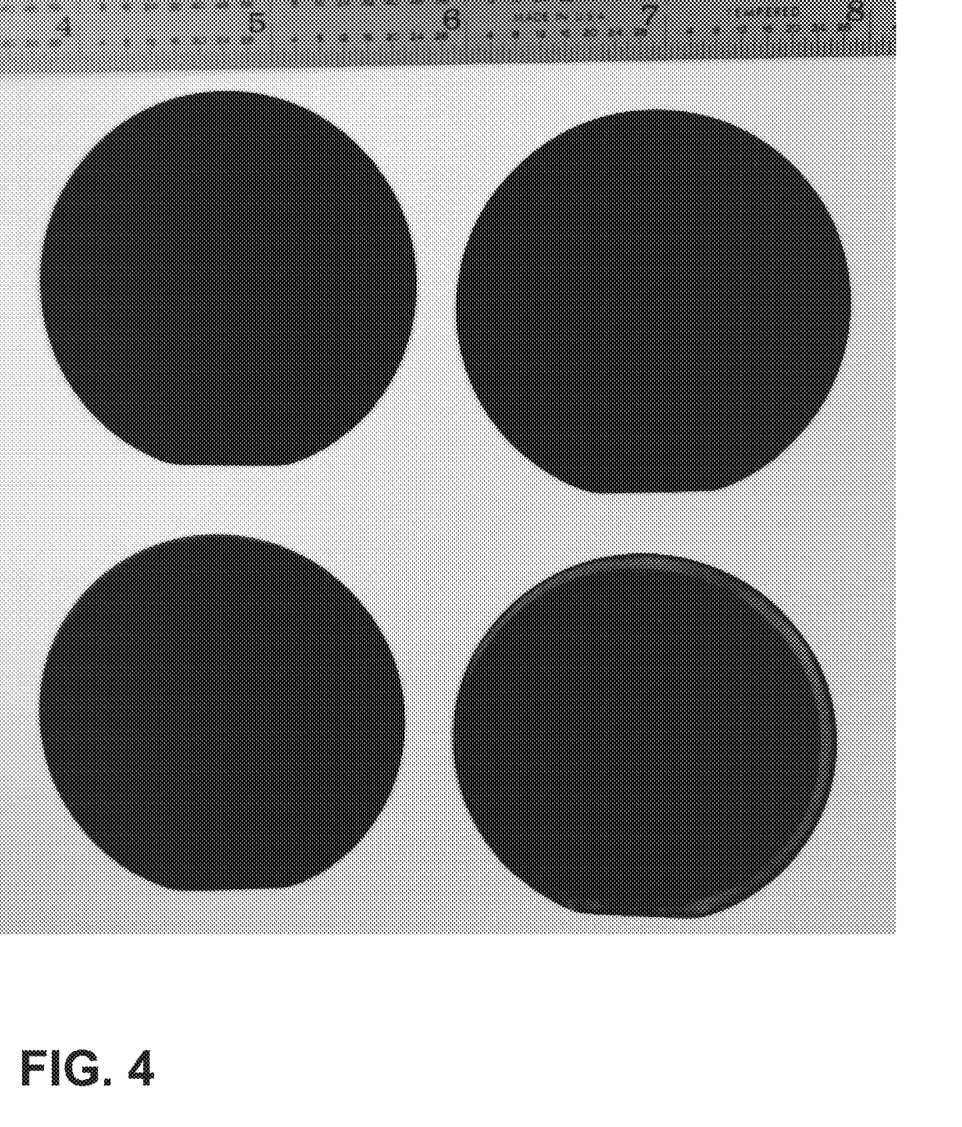
FIG. 4 is a photographic image of sapphire substrates/wafers that have been coated with a thermal absorption coating, wherein the top left wafer is coated but not yet baked, the top right wafer has been baked but has not yet been coated in an epitaxial process, the bottom left wafer has been coated in an epitaxial process but the thermal absorption coating has not yet been removed, and the bottom right wafer has had the thermal absorption coating removed.

After the thermally absorptive coating 10 is applied to surface 8A of sapphire wafer 1A, the thermally absorptive coating 10 is allowed to dry at step 28 before baking. Drying may be accomplished in air at room temperature for 30 minutes. This gives the thermally absorption coating 10 time to adhere and bond to the surface 8A tightly for effective conduction heat transfer to the sapphire substrate/wafer 1A. Completion of step 28 results in a dried (but not baked) wafer as shown upper-left in FIG. 4.

As shown at step 30, the sapphire substrate/wafer 1A with thermally conductive coating 10 may then be incrementally heated (baked) in a furnace before exposing the sapphire substrate/wafer 1A to the high temperatures and vacuum environment during epitaxy. A baking process according to the present disclosure may start at about 400° C. (for about 15 minutes), increase to about 500° C. (for about an additional 15 minutes), then reach a maximum of about 650° C. (for about an additional 20 minutes). It will be understood that these times and temperatures are examples of suitable times and temperatures, but the present invention is not limited to these specific times/temperatures. For example, the times could be reduced to provide higher production rates. Completion of baking (step 30) results in a wafer as shown upper-right in FIG. 4. Baking removes acetone, solvents, any polymer binders, and any other organic material that could otherwise contaminate vacuum deposition chambers and interfere with film deposition during epitaxy. Also, baking provides better adhesion of the thermally absorptive coating 10 to the surface 8A of the sapphire substrate/wafer 1A.

The sapphire substrate/wafer 1A and thermally absorptive coating 10 are then slowly cooled at step 32. This annealing involves slow cooling of back-side coated sapphire substrate/wafer 1A from about 650° C. to about room temperature. Slow cooling avoids the potential risks of thermal shock and cracking of the sapphire substrate/wafer 1A. The sapphire substrate/wafer 1A is allowed to cool for a few minutes to let the temperature decrease by at least about 200-300° C. before removing the sapphire substrate/wafer 1A from the furnace.

As shown at step 34, the coated sapphire substrate/wafer 1A may then be positioned in a vacuum deposition chamber. A layer 50 of material (see also FIG. 5) such as GaN or SiGe is then deposited on polished surface 9A utilizing a known epitaxial process. The epitaxial process may comprise a magnetron sputtering process. However, the epitaxial process may comprise virtually any deposition process or system that uses radiative heating on a non-deposition side of a substrate. Testing has shown that the thermally absorptive coating 10 is stable during deposition at about 900° C. for 2 or more hours. A wafer having an epitaxial layer prior to removal of thermally absorptive coating 10 is shown in the bottom left of FIG. 4.

It will be understood that the process 60 of FIG. 3 may comprise a batch process in which a plurality of substrates such as sapphire substrates/wafers 1A are simultaneously processed utilizing steps 26-36.

In an industrial process, the thermally absorptive coating 10 might present a contamination risk, or it may act as a graphitic conductor and produce undesirable parasitic capacitances. Thus, the thermally absorptive coating 10 is preferably removed via sonication (step 36) and cleaned (if required).

Figure 5:
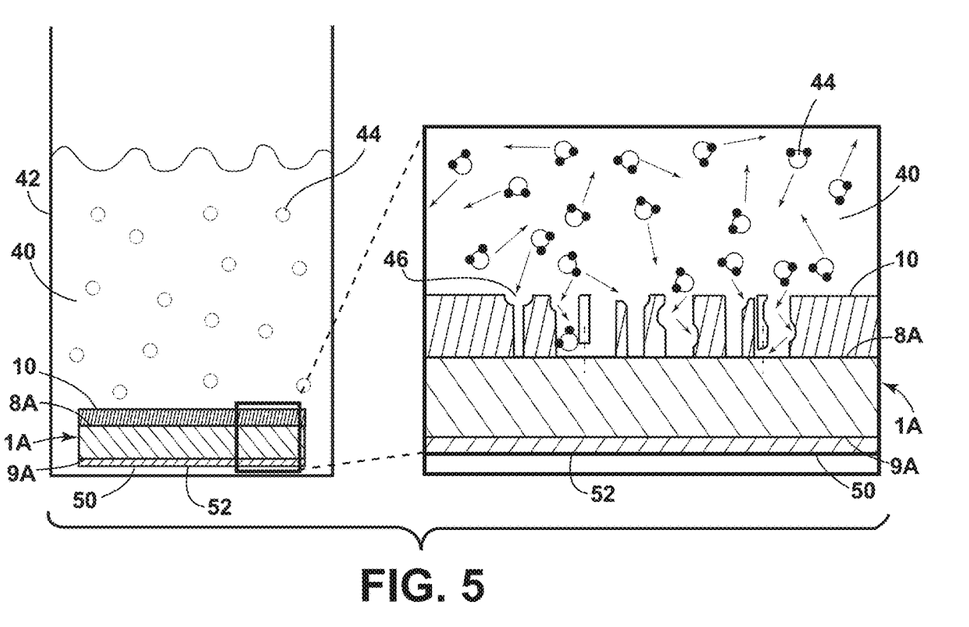
FIG. 5 is a schematic view showing removal of a thermal absorption coating utilizing vibrating water molecules (sonication).

With further reference to FIG. 5, removal of thermally absorptive coating 10 may be accomplished by immersing a sapphire substrate/wafer 1A in deionized water 40 in a container 42. The thickness of the thermally absorptive coating 10 in FIG. 5 is increased (exaggerated) for purposes of illustration. Accordingly, it will be understood that the thermally absorptive coating 10 may be significantly thinner relative to the sapphire substrate/wafer 1A and coating 52 than what is shown in FIG. 5. The wafer 1A is preferably positioned with coating side 8A and the thermally absorptive coating 10 facing upwardly. Water 40 is then sonicated to break up the thermally absorptive coating 10. On the molecular scale, water molecules 44 are energized by ultrasonic waves and collide more frequently and vigorously, pushing each other into crevices 46 in the thermally absorptive coating 10. This breaks off particles of the thermally absorptive coating 10 until the underlying surface 8A of the sapphire substrate/wafer 1A is exposed. The energetized water molecules 44 continue to break away the edges of the thermally absorptive coating 10 wherever such exposure to the surface 8A of sapphire substrate/wafer 1A exists. No chemicals are required for this process, and the surface 8A is usually cleaned within about 15 minutes of sonication, leaving the front side 52 of the epitaxial film 50 unharmed. A substrate/wafer with thermally absorptive coating 10 removed is shown at the bottom right in FIG. 4. Sonication in water 40 dissolves and breaks up the coating 10 into particles. Some of these particles may be loosely deposited on the surface of epitaxial layer 50 when sapphire substrate/wafer 1A is removed from water 42. However, any such particles may be rinsed off easily with clean deionized water.

As discussed above, surfaces 8A and 9A may both be polished, and epitaxial layers may optionally be formed on both surfaces 8A and 9A. In this case, after removal of the thermally absorptive coating 10 from surface 8A, the sapphire substrate/wafer 1A is then cleaned and dried, and a thermally absorptive coating 10 is then applied to surface 52 of epitaxial coating 50 utilizing steps 26-32 (FIG. 3), and a film is then deposited on a surface 8A (step 34). As discussed above, surface 8A may be treated with solvents and/or polished after the thermally absorptive coating 10 is initially removed via sonication (step 36) to ensure that an epitaxial layer can be deposited on surface 8A. The thermally absorptive coating 10 is then removed (step 36) and cleaned (step 38).

The selection of a suitable thermally absorptive coating 10 may take into account several factors. For example, the thermally absorptive coating 10 is preferably a readily available and inexpensive coating material. Also, the thermally absorptive coating 10 preferably provides an easy way to make a uniform, even coating on surface 8A and/or surface 9A.

During testing, several types of coating materials (e.g. paints) failed due to break up under the heat of baking and epitaxial processes. These failures led to thermal shadows and non-uniform wafer temperature. The thermally absorptive coating 10 selected for backside coating of the sapphire substrate/wafers 1A comprises black silicate-containing spray paint. The black pigments (copper chromium and carbon black) and high temperature stability of this coating material ensures high thermal absorption even under typical substrate temperatures (about 400-900° C.) during epitaxial growth (see e.g. top left coated wafer of FIG. 4). This coating maintained adherence to the sapphire substrate/wafer 1A even after 2 or more hours of epitaxial growth.

Figure 4A:
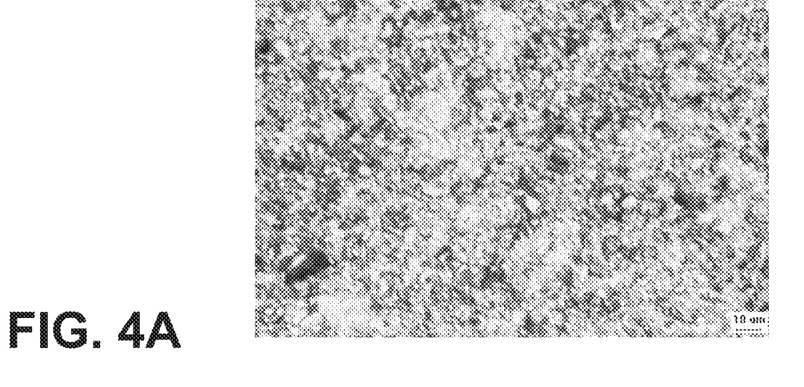
FIG. 4A is an optical micrograph of a blank sapphire wafer.
Figure 4B:
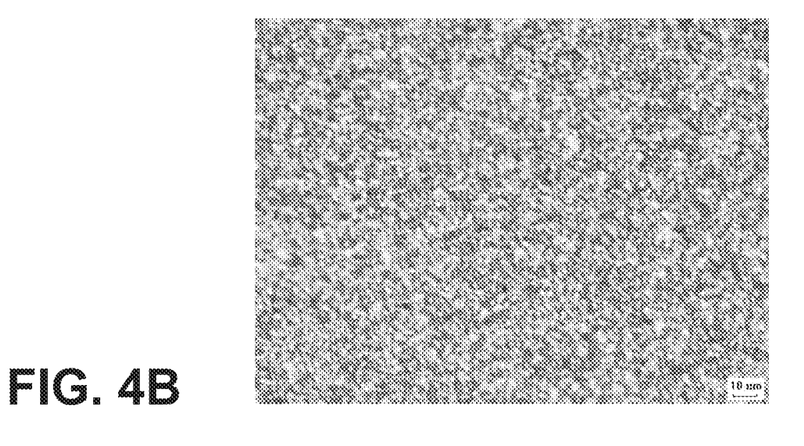
FIG. 4B is an optical micrograph of a sapphire wafer after a thermal absorption coating has been applied.
Figure 4C:
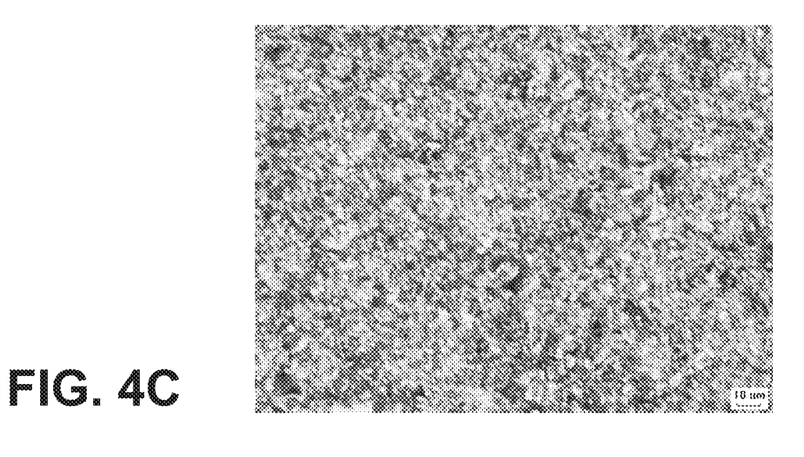
FIG. 4C is an optical micrograph of a sapphire wafer after the thermal absorption coating has been removed utilizing sonication.

FIGS. 4A-4C are optical micrographs of sapphire wafers. FIG. 4A is an optical micrograph of a blank sapphire wafer. FIG. 4B shows a sapphire wafer after the thermally absorptive coating 10 is applied, and FIG. 4C shows a sapphire wafer after the thermally absorptive coating 10 is removed via sonication. The image of FIG. 4C is darker than the image of FIG. 4A due to an epitaxial film of SiGe on the polished side of the sapphire wafer of FIG. 4C.

As discussed above, the thermally absorptive coating 10 of the present disclosure may be applied to various substrates utilizing the processes described above. For example, the substrate could comprise glass, quartz, or diamond. Similarly, the thermally absorptive coating 10 and processes described above may also be utilized in connection with substrates comprising higher bandgap materials that are at least partially transparent to infrared light such as GaAs, GaN, Silicon, and Germanium. Removal of the thermally absorptive coating 10 from sapphire or other substrates may be accomplished via sonification (FIG. 5). The thermally absorptive coating 10 may also be removed by applying a high speed stream of gas (e.g. compressed air or other suitable gas), a stream of water or other fluid. Solvents such as acetone may also be utilized.

The use of a spray paint as a thermally absorptive coating for sapphire or other optically transparent substrates has a number of benefits over prior methods (e.g. metal sputtering in a vacuum chamber or thermal soak). First, the thermally absorptive coating 10 described above raises the sapphire temperature more effectively. As discussed above, sapphire substrates have low thermal absorption due to the optical transparency of thin sapphire wafers. However, the application of an opaque thermally absorptive coating 10 allows the process to obtain high wafer temperatures with less input heat, saving energy and enabling high temperature growths. Also, the thermally absorptive coating 10 may be black, which is more thermally absorptive than gray metal backside coatings. The thermal coating process of the present disclosure provides a high yield production of sapphire wafers by reducing the overall processing time and cost.

Spray application of the thermally absorptive coating 10 does not normally result in significant defects such as breaks, flakes, bubbles, and unevenness in the thermally absorptive coating 10. These types of coating irregularities can cause issues with thermal shadows and consequent temperature gradients within the sapphire substrate/wafer 1A and inconsistent thin film quality.

The thermally absorptive coating process of the present disclosure is also faster than prior methods. Prior methods may be time consuming and problematic. In some prior methods the sapphire substrate/wafer was loaded into the vacuum system, pumped down, and the metal coating was then applied via a sputtering process. These steps typically require approximately 4 hours total to produce a coating thick enough on one wafer for adequate heat absorption. Also, only about 3-4 wafers could be done before having to vent the system, reload the crucible, and pump down the system, a process that took approximately a half of a day. In contrast, the method of the present disclosure is scalable to permit processing of multiple substrates (e.g. wafers) simultaneously. Specifically, the coating, baking, and removal steps may be accomplished with batches of wafers as a separate batch process. Through such processes with multiple sapphire substrates, a relatively large number of substrates (wafers) can be readily provided for epitaxial deposition within a few minutes.

The thermally absorptive coating 10 and process of the present disclosure also utilizes less advanced/expensive equipment compared to prior methods. Prior methods, such as metal coating or thermal soak, may suffer from expensive operation of sputtering systems for metal coating or time-consuming thermal soaking processes, respectively. These prior processes may induce system failures of vacuum systems due to the strayed metal deposition on windows, sensors, and the inside walls of the vacuum system. This may interfere with various components of the system such as the substrate rotation gears. Furthermore, these prior processes may result in flakes of metal being deposited on chamber viewports. These metal flakes may also contaminate other electron beam evaporator crucibles.

The thermally absorptive coating 10 of the present disclosure can be applied without the need for high-maintenance vacuum equipment, resulting in a far lower operating costs and a simpler, more robust manufacturing process.

It is to be understood that variations and modifications can be made on the aforementioned structure without departing from the concepts of the present disclosure, and further it is to be understood that such concepts are intended to be covered by the following claims unless these claims by their language expressly state otherwise.

What is claimed is:

1. A method of forming an epitaxial layer on a sapphire substrate having first and second opposite side surfaces, the method comprising:
    coating the first opposite side surface of the sapphire substrate with an energy-absorbing opaque paint that is stable at high temperatures to form a thermally absorptive coating on the first side of the sapphire substrate;
    incrementally heating the coated sapphire substrate to remove contaminants originated from the thermally absorptive coating, wherein incrementally heating the coated sapphire substrate comprises baking the coated sapphire substrate at a first temperature below about 650° C. for a first time period, followed by baking the coated sapphire substrate at a second temperature above the first temperature and below 650° C. for a second time period, followed by baking the coated sapphire substrate at about 650° C. for a third time period and wherein the first time period, the second time period, and the third time period are each at least about 15 minutes;
    cooling the coated sapphire substrate;
    positioning the coated sapphire substrate in a vacuum deposition chamber;
    heating the coated sapphire substrate in the vacuum deposition chamber by directing radiative energy onto the thermally absorptive coating on the first side of the sapphire substrate;
    forming an epitaxial layer on the second side of the coated sapphire substrate opposite the thermally absorptive coating.

2. The method of claim 1, wherein:
    the paint is applied using a room temperature spray process.

3. The method of claim 2, further comprising:
    allowing the paint to dry at about room temperature before removing contaminants from the thermally absorptive coating by incrementally heating the coated sapphire substrate.

4. The method of claim 1, wherein:
    the paint comprises at least one pigment, wherein the at least one pigment comprises one or more of copper, chromium, or carbon black.

5. The method of claim 1, further comprising:
    polishing the first and second opposite side surfaces of the sapphire substrate; and
    wherein the sapphire substrate comprises a C-plane sapphire material.

6. The method of claim 5, further comprising:
    forming the epitaxial layer on the second side of the coated sapphire substrate opposite the thermally absorptive coating by applying a molecular beam of target material to develop the epitaxial layer on the second opposite side surface after applying the paint on the epitaxial layer on the first opposite side surface.

7. The method of claim 1, wherein:
    the first temperature is about 400° C.;
    the second temperature is about 500° C.;

incrementally heating the coated sapphire substrate comprises heating the coated sapphire substrate to about 650° C.; and
wherein the coated sapphire substrate is a wafer.

8. The method of claim 1, further comprising:
forming an epitaxial layer of GaN on the second opposite side surface of the coated sapphire substrate;
wherein the coated sapphire substrate is heated in the vacuum deposition chamber to a temperature of at least about 850° C.; and
wherein the coated sapphire substrate is a wafer.

9. The method of claim 1, further comprising:
forming an epitaxial layer of SiGe on the second opposite side surface of the coated sapphire substrate;
wherein the coated sapphire substrate is heated in the vacuum deposition chamber to a temperature of at least about 890° C.; and
wherein the coated sapphire substrate is a wafer.

10. The method of claim 1, further comprising:
positioning the sapphire substrate in water;
removing the thermally absorptive coating by sonicating the water; and
wherein the coated sapphire substrate is a wafer.

11. A method of forming an epitaxial layer on a sapphire substrate having first and second opposite side surfaces, the method comprising:
coating the first opposite side surface of the sapphire substrate with an energy-absorbing opaque paint that is stable at high temperatures to form a thermally absorptive coating on the first side of the sapphire substrate;
incrementally heating the coated sapphire substrate to remove contaminants originated from the thermally absorptive coating;
cooling the coated sapphire substrate;
positioning the coated sapphire substrate in a vacuum deposition chamber;
heating the coated sapphire substrate in the vacuum deposition chamber by directing radiative energy onto the thermally absorptive coating on the first side of the sapphire substrate; and
forming an epitaxial layer on the second side of the coated sapphire substrate opposite the thermally absorptive coating,
wherein:
incrementally heating the coated sapphire substrate comprises heating the coated sapphire substrate to about 650° C.;
the coated sapphire substrate is a wafer; and
the coated sapphire substrate is baked at about 400° C. for about 15 minutes, followed by baking at about 500° C. for about 15 minutes, followed by baking at about 650° C. for at least about 20 minutes.

12. The method of claim 11, further comprising:
allowing the coated sapphire substrate to cool at about room temperature to about 450° C. or less after baking the coated sapphire substrate at about 650° C.

13. A method of forming an epitaxial layer on a substrate having first and second opposite side surfaces, the method comprising:

coating at least a portion of the first opposite side surface of the substrate with an energy-absorbing opaque paint that is stable at high temperatures to form a thermally absorptive coating on the first side of the substrate resulting in a coated substrate;
heating the coated substrate to remove contaminants from the thermally absorptive coating by baking the coated sapphire substrate at a first temperature less than about 650° C., then baking the coated sapphire substrate at a second temperature above the first temperature and below about 650° C. for a second time period, followed by baking the coated sapphire substrate at about 650° C. for a third time period, wherein the first time period, the second time period, and the third time period are each at least about 15 minutes;
positioning the coated substrate in a vacuum deposition chamber;
heating the coated substrate in the vacuum deposition chamber by directing radiative energy onto the thermally absorptive coating;
forming an epitaxial layer on the second side of the coated substrate opposite the thermally absorptive coating; and
removing the thermally absorptive coating.

14. The method of claim 13, further comprising:
the first temperature is about 400° C.;
the second temperature is about 500° C.; and
cooling the coated substrate to about to 450° C. or less after baking the coated sapphire substrate at about 650° C. and before positioning the coated substrate in a vacuum deposition chamber.

15. The method of claim 14,
further comprising allowing the paint to dry before heating the coated substrate.

16. The method of claim 13, wherein:
the substrate comprises a material that transmits at least one of visible light or infrared light.

17. The method of claim 13, wherein:
the substrate comprises a material selected from sapphire, glass, quartz, diamond GaAs, GaN, silicon or Germanium.

18. The method of claim 13, wherein:
the coated substrate comprises a coated sapphire wafer.

19. The method of claim 18, further comprising
forming an epitaxial layer of GaN on the second opposite side surface of the coated sapphire wafer; and
wherein the sapphire wafer is heated in the vacuum deposition chamber to a temperature of at least about 850° C.

20. The method of claim 18, further comprising:
forming an epitaxial layer of SiGe on the second opposite side surface of the coated sapphire wafer; and
wherein the coated sapphire wafer is heated in the vacuum deposition chamber to a temperature of at least about 890° C.

* * * * *